US008138816B2

(12) United States Patent
Freeston et al.

(10) Patent No.: US 8,138,816 B2
(45) Date of Patent: Mar. 20, 2012

(54) DIGITALLY CONTROLLED HIGH Q FACTOR CAPACITOR

(75) Inventors: Andrew K. Freeston, Windham, NH (US); Jack Redus, Hollis, NH (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 142 days.

(21) Appl. No.: 12/729,440

(22) Filed: Mar. 23, 2010

(65) Prior Publication Data

US 2011/0234261 A1    Sep. 29, 2011

(51) Int. Cl.
*H03K 5/00*    (2006.01)

(52) U.S. Cl. .......................... 327/337; 327/94; 327/554

(58) Field of Classification Search .......... 327/336–337, 327/94, 554
See application file for complete search history.

(56) References Cited

U.S. PATENT DOCUMENTS

| | | | |
|---|---|---|---|
| 6,677,688 B2 | 1/2004 | Freeston et al. | 307/113 |
| 6,742,272 B2 * | 6/2004 | Eto et al. | 33/507 |
| 7,084,710 B2 * | 8/2006 | Huang et al. | 331/16 |
| 7,321,588 B2 | 1/2008 | Freeston et al. | 370/392 |

* cited by examiner

*Primary Examiner* — Dinh T. Le
(74) *Attorney, Agent, or Firm* — Christopher P. Maiorana, PC

(57) ABSTRACT

A control circuit and a conversion circuit. The control circuit may be configured to generate an analog control signal in response to a digital control signal. The conversion circuit may be configured to generate a capacitance signal in response to the analog control signal.

16 Claims, 13 Drawing Sheets

DIGITALLY CONTROLLED HIGH Q FACTOR CAPACITOR

FIELD OF THE INVENTION

The present invention relates to capacitors generally and, more particularly, to a method and/or apparatus for implementing a digitally controlled high Q factor capacitor.

BACKGROUND OF THE INVENTION

Conventional approaches for implementing a digitally switched capacitor use transistor or diode switches in series with fixed value capacitors. A logic circuit is used to control which capacitors are connected through the switches to create a capacitance according to the particular needs of a user. Such an approach has several drawbacks. The maximum possible Q (quality factor) is limited by the resistance of the switching circuit. Since the resistance component of the capacitor is small, and the fixed capacitor values are small, resistance added by the switching circuit negatively impacts the Q factor of the entire circuit. A high Q factor capacitance is necessary for effectively implementing the circuit designs using the capacitor. Competitive products on the market tend to draw customer complaints when the Q factor is low (i.e., below 100).

Referring to FIG. 1, a circuit 10 is shown implementing a conventional approach for implementing a switched capacitor. The circuit 10 uses a number of switch devices 12a-12n in series with a number of fixed value capacitors 14a-14n. By changing the state (i.e., ON or OFF) of the switch devices 12a-12n, the respective fixed value capacitors 14a-14n are added or subtracted from the overall capacitance generated by the circuit 10. By closing the particular switch devices 12a-12n, the overall capacitance available to the application is varied. The fixed capacitors 14a-14n are typically set up in a configuration that enables a consistent step size of the capacitors 12a-12n. The circuit 10 can be used in applications such as digitally varied filter networks, oscillators, antenna matching circuits, amplifier feedback circuits, adaptive matching circuits, software-defined-radios, phase shifters, radar components, military electronic warfare applications, and other circuits where a variable capacitance would be useful. When using the circuit 10 as a capacitor in a circuit design, the resistive portion of the impedance becomes a problem and limits the "sharpness" of a resonance created by the circuit 10. The inaccuracy of the circuit 10 reduces the effectiveness of the abovementioned applications.

In particular, the switch devices 12a-12n are a limiting factor of the quality factor of the capacitance generated by the circuit 10. For a given semiconductor process, there are finite limits to how much the resistance of the switch devices 12a-12n can be lowered when turned on. As the overall size of the switch devices 12a-12n increases, the resistance when turned on decreases. However, other performance metrics (i.e., when the isolation decreases significantly, the effect of parasitic capacitance, etc.) degrade when increasing the size of the switch devices 12a-12n. Such degradation will add loss to the circuit 10, which effectively will reduce the Q factor that the large switching circuit is trying to improve.

Consider the formula $Q=X_c/R$, where $X_c$ is the capacitive reactance and R is the resistance. $X_c$ varies inversely with frequency. At higher frequencies, $X_c$ becomes quite small for a given capacitor value. The value R is frequency invariant. Conventional approaches having significant fixed R can significantly limit potential Q values.

It would be desirable to implement a digitally variable capacitor that may have a high Q factor.

SUMMARY OF THE INVENTION

The present invention concerns a control circuit and a conversion circuit. The control circuit may be configured to generate an analog control signal in response to a digital control signal. The conversion circuit may be configured to generate a capacitance signal in response to the analog control signal.

The objects, features and advantages of the present invention include providing a digitally controlled capacitor that may (i) have a high Q factor capacitance, (ii) provide antenna matching, (iii) provide filter tuning, (iv) provide on-the-fly VSWR adjustments, (v) provide rapid band switching, (vi) have potential in subsystems for phase shifting and/or variable filtering, and/or (vii) be easy to implement.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
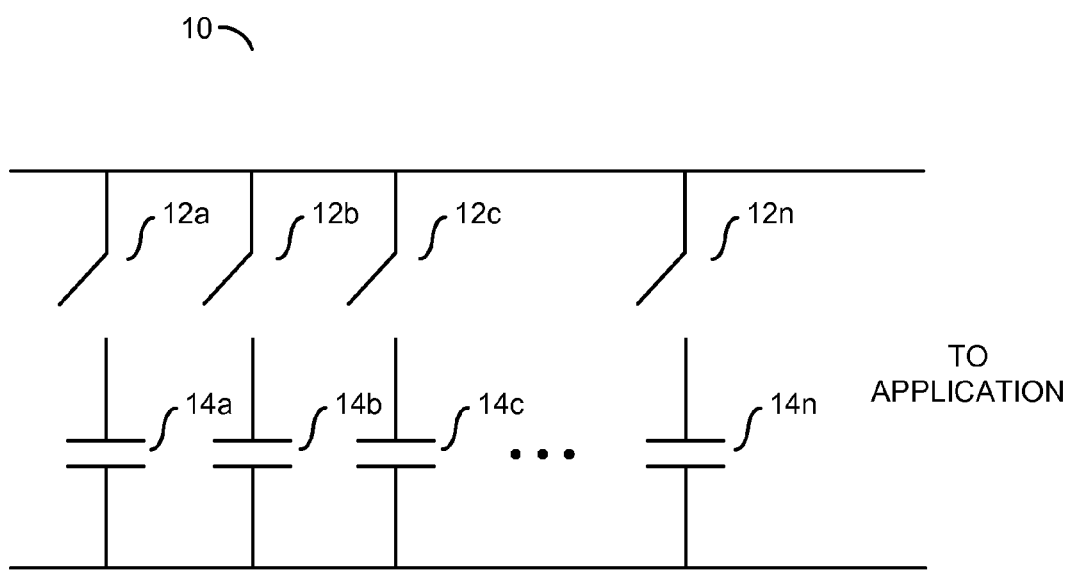
FIG. 1 is a diagram illustrating a conventional digitally controlled capacitor.
Figure 2:
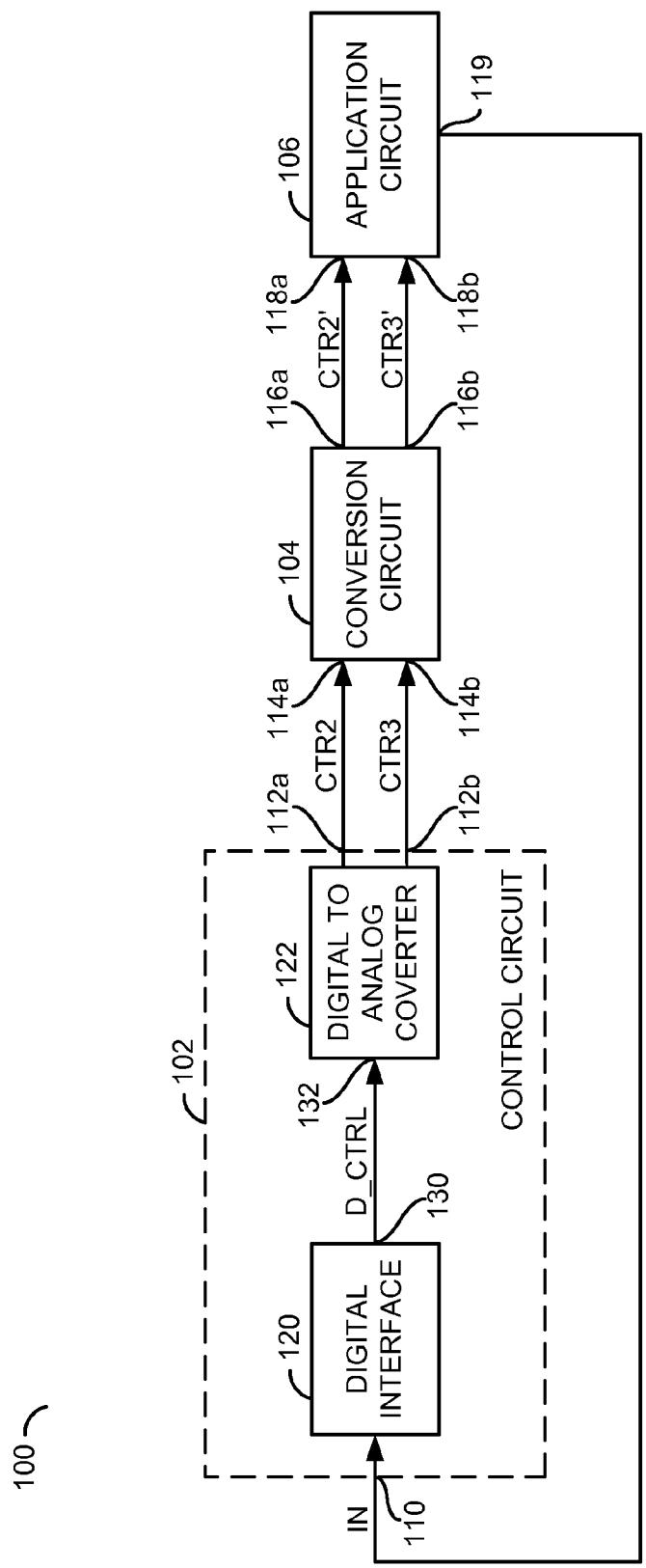
FIG. 2 is a diagram of an embodiment of the present invention.

Referring to FIG. 2, a block diagram of a circuit 100 is shown in accordance with an embodiment of the present invention. The circuit 100 generally comprises a block (or circuit) 102, a block (or circuit) 104 and a block (or circuit) 106. The circuit 102 may be implemented as a control circuit. The circuit 104 may be implemented as a conversion circuit. In one example, the circuit 104 may be implemented as a varactor circuit. The circuit 106 may be implemented as an application circuit.

The circuit 102 may have an input 110 that may receive a signal (e.g., IN), an output 112a that may present a signal (e.g., CTR2), and an output 112b that may present a signal (e.g., CTR3). The circuit 104 may have an input 114a that may receive the signal CTR2 and an input 114b that may receive the signal CTR3. The circuit 104 may have an output 116a that may present a signal (e.g., CTR2') when excited by circuit 106 and an output 116b that may present a signal (e.g., CTR3') when excited by circuit 106. The circuit 106 may have an input 118a that may receive the signal CTR2' and an input 118b that may receive the signal CTR3'. The circuit 106 may also have an output 119 that may present the signal IN.

The signal CTR2 and the signal CTR3 may be implemented in a differential configuration. However, a single ended configuration (e.g., implementing only one of the signals CTR2 and/or the signal CTR3) may be implemented to meet the design criteria of a particular implementation. Similarly, the signal CTR2' and the signal CTR3' are shown implemented in a differential configuration. The impedance between the signal CTR2' and the signal CTR3' and ground may be a capacitance of varying value. The signal CTR2' and the signal CTR3' may also be implemented in a single ended implementation (e.g., implementing only one of the signals CTR2' and/or the signal CTR3').

In one example, the signal IN may be implemented as a multi-bit digital data word. The particular format of the signal IN may be varied to meet the design criteria of a particular implementation. For example, the signal IN may be a serial signal, an adjustable serial signal, a parallel signal and/or other appropriate protocol to meet the design criteria of a particular implementation.

The circuit 102 generally comprises a block (or circuit) 120 and a block (or circuit) 122. The circuit 120 may be implemented as a digital interface circuit. The circuit 122 may be implemented as a digital-to-analog converter (DAC) circuit. The circuit 120 may have an input that may receive the signal IN and an output 130 that may present a signal (e.g., D_CTRL). The circuit 122 may have an input 132 that may receive the signal D_CTRL, an output that may present the signal CTR2 and an output that may present the signal CTR3. The circuit 120 may be implemented as logic or other appropriate circuitry to convert the signal IN into the signal D_CTRL. The signal D_CTRL may have a digital value generated in response to the particular value of the signal IN. The circuit 122 may convert the signal D_CTRL into the signal CTR2 and/or the signal CTR3. The signal CTR2 and the signal CTR3 may be analog voltage control signals.

The circuit 102 and the circuit 104 may be implemented using a variety of processing techniques. For example, ED pHEMT, Silicon, and/or D-pHEMT techniques may be implemented. In one example, the circuit 102 and the circuit 104 may be implemented in the same package. The driver circuit 102 may be implemented in a variety of technologies successfully. In general, the circuit 104 may be implemented as a varactor. In one example, the circuit 102 and the circuit 104 may be implemented using different processing techniques. For example, a varactor implementation of the circuit 104 may be easier to implement in one process (e.g., silicon) than in the other process (e.g., a pHEMT process). In one example, the circuit 104 may be implemented as a high Q factor varactor diode.

In general, a wide array of varactor diodes with high Q factor values may be used and are commercially available. A GaAs based varactor diode may be a particularly suitable choice for implementing a high Q factor varactor diode in the circuit 104. A GaAs based varactor diode with a narrow tuning range (e.g., under 8V) may be used in the circuit 104. A GaAs based varactor diode with a wide tuning range may also be used in the circuit 104. A combination of series and/or parallel varactors may be implemented to build up the tuning range of the circuit 104.

The digital to analog converter circuit 122 and the digital interface circuit 102 may be used to interpret a multi-bit input signal IN to implement a particular voltage across a varactor diode in the conversion circuit 104. The particular voltage may be configured to obtain a desired capacitance (e.g., stepped in logical fixed or variable increments). The control circuit 102 may be designed to account for capacitance versus reverse bias varactor voltage nonlinearities. For example, a log-amplifier circuit may be used to linearize the capacitance versus reverse bias varactor voltage. An op-amp may be used in the log-amplifier circuit to create a voltage output proportional to the log of the voltage. When using a digital to analog converter, the step size may incorporate linearizing the capacitance versus reverse bias varactor voltage.

Figure 3:
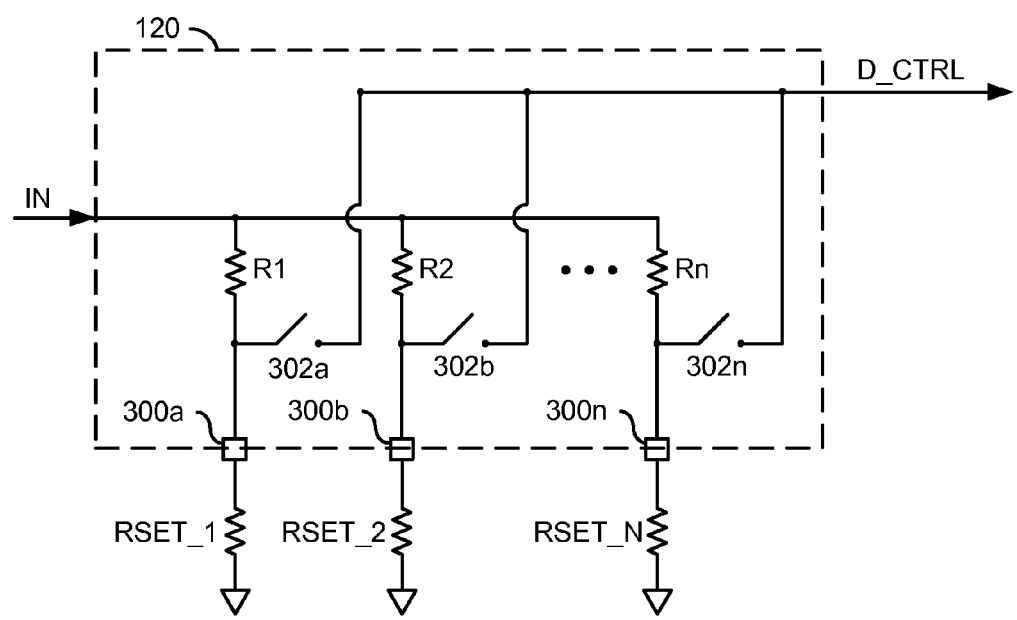
FIG. 3 is a more detailed diagram of the digital interface circuit of FIG. 2.

Referring to FIG. 3, a more detailed diagram of the digital interface 120 circuit is shown. The digital interface 120 circuit may provide the ability to design flexibility into the control circuit 102. The digital interface circuit generally comprises a number of resisters R1-Rn, a number of bond pads 300a-300n, and a number of switches 302a-302n. The bond pads 300a-300n may be implemented to allow different voltage points to be set. The voltage points may be used to adjust the capacitance range and/or step size for custom applications. The switches may be used to select a number of capacitances (e.g., 0, 0.5 pF, 1 pf, 2 pf, etc.). The switches 302a-302n may be controlled by the digital input IN. The signal D_CTRL may be presented to the digital to analog converter.

In another example, an addressable serial (or a non-addressable serial) interface may be implemented to allow ease of use on a variety of system platforms. Such an interface may be described in U.S. Pat. No. 7,321,588, which is incorporated by reference in its entirety.

A number of resistors RSET_1-RSET_N may also be used for added flexibility. The resistors RSET_1-RSET_N may be implemented off chip. Alternatively, the resistors RSET_1-RSET_N may be used to set particular reference voltages in the D to A converter 122. Such a method may be used to set voltage step ranges that linearize the output capacitance of the varactor.

Figure 4:
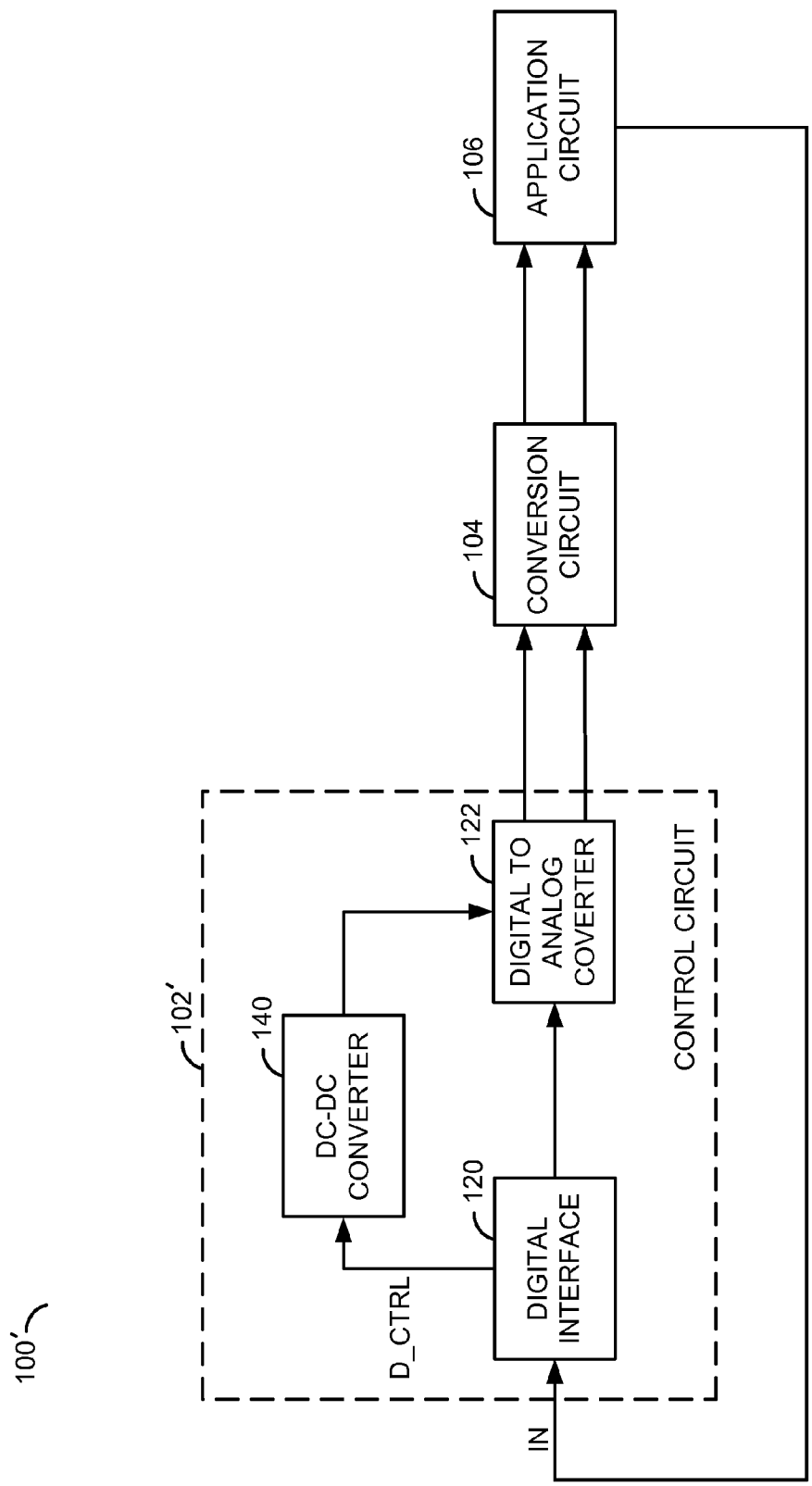
FIG. 4 is a diagram of another embodiment of the present invention.

Referring to FIG. 4, a circuit 100' is shown implementing an alternate embodiment. A circuit 102' is shown implementing the circuit 120, the circuit 122 and a circuit 140. In one example, the circuit 140 may be implemented as a low current, DC-DC converter circuit. The circuit 140 may be implemented using CMOS, ED pHEMT, or other semiconductor processes. However, the circuit 140 may also be implemented using a variety of semiconductor processes. The circuit 140 may allow a larger tuning range to be implemented. The circuit 140 may receive the signal D_CTRL. The digital to analog converter circuit 122 may respond to varying a frequency of operation of the DC-DC converter circuit 140, which will adjust the output voltage of the circuit 122. Such an implementation may be used to achieve a variety of desired bias points.

Figure 5:
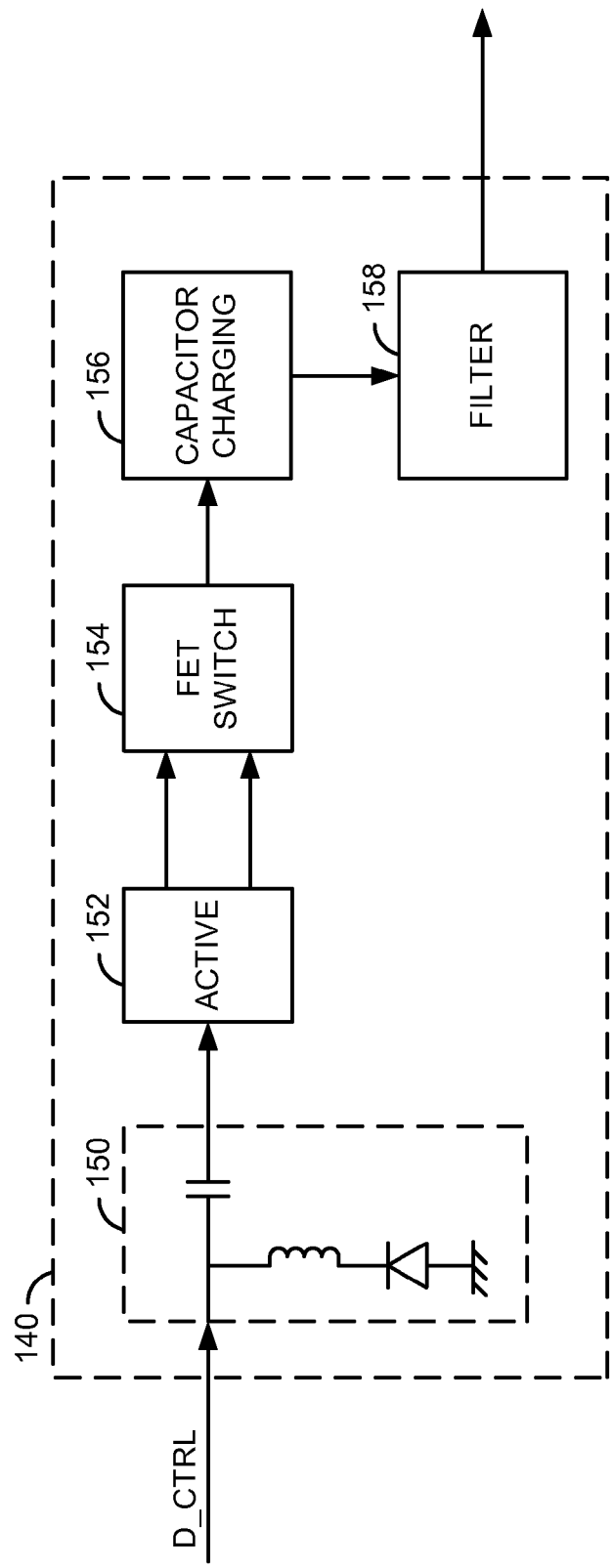
FIG. 5 is a more detailed diagram of the DC-DC conversion circuit of FIG. 4.

Referring to FIG. 5, a more detailed diagram of the circuit 140 is shown. The circuit 140 may be implemented as a variable-frequency DC-DC converter circuit. The circuit 140 generally comprises a block (or circuit) 150, a block (or circuit) 152, a block (or circuit) 154, a block (or circuit) 156 and a block (or circuit) 158. The circuit 150 may be implemented as a tank circuit. The circuit 152 may be implemented as an active circuit. The circuit 154 may be implemented as an FET switch circuit. The circuit 156 may be implemented as a capacitor charging circuit. The circuit 158 may be implemented as filter circuit. The circuit 140 may be used to tune the voltage of the circuit 104. The tuning may be implemented in a variety of ways. In one example, a varactor may be implemented in the tank circuit 150. The varactor may be placed in parallel or series with an inductor to create resonance in the tank circuit 150. The resonance from the tank circuit 150 may be used in conjunction with the active circuit 152 to create an oscillator. The active circuit 152 may be single ended or double ended depending on the oscillator configuration.

In a double ended configuration, the active circuit 152 may implement complementary outputs presented to the FET switch circuit 154. The oscillator 160 may alter the FET switch circuit 154 conditions to charge capacitors in the capacitor charging circuit 156. The filter circuit 158 may be used to reduce and/or eliminate unwanted noise generated by the DC-DC converter.

The circuit 140 illustrates one example for implementing a DC-DC converter. Other implementations may be used to meet the design criteria of a particular implementation. An RC time constant may be used while charging and/or discharging capacitors. By considering this, varying the frequency and/or duty cycle of the oscillator pulses may be used to vary the output voltage based on the load.

The tank circuit 150 may also be used to linearize the output capacitance step of the reverse bias varactor proportional to the desired reverse bias varactor voltage. The tank circuit 150 may have a second varactor with a capacitance curve similar to the varactor being tuned for the output capacitance. If a second varactor is used, the tuning varactor diode of the tank circuit 152 may be selected to vary the frequency in proportion to an input control. As a result, the output varactor may vary according to desired step sizes. The varactor in the tank 152 may use less expensive technology, such as a lower Q value, since the varactor is already in series with a resistor. Therefore, the tuning voltage may extend across the varactor which connects to the application circuit 106.

The digital to analog converter 122 created by the DC-DC converter 140 with variable output voltage may be used in conjunction with the digital interface circuit 120 to present a particular voltage across the varactor diode, based on a multi-bit input signal. The output of the DC-DC converter 140 may be varied in different ways. A varactor diode may be used in the tank circuit 150 of the DC-DC converter 140. Such an implementation may provide the ability to use varactor diodes with similar properties in the tank circuit 150 of the DC-DC converter 140 as well as in the varactor diode that is being tuned. Nonlinearities in the capacitance range may be linearized. For example, the properties of the varactor may be used redundantly to assist in linearizing the capacitance range.

Figure 6:
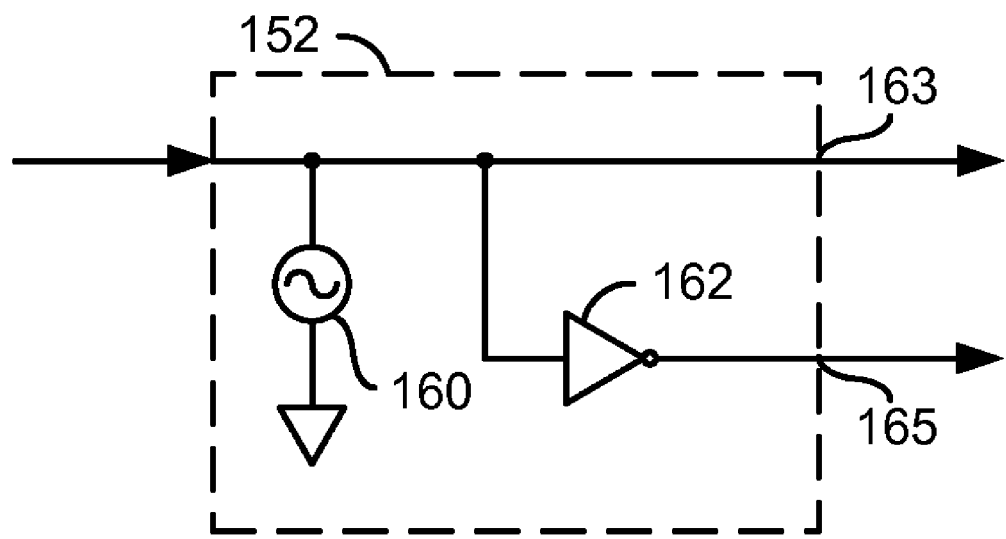
FIG. 6 is a more detailed diagram of the tank circuit of the DC-DC conversion circuit.

Referring to FIG. 6, a more detailed diagram of the active circuit 152 is shown. The active circuit 152 generally comprises an oscillator 160 and an inverter 162. In order to create a signal that oscillates, the active circuit 152 may be implemented to provide gain. The active circuit 152 may be used in conjunction with the resonant circuit 150. The circuit 150 and the circuit 152 work together to create, in one example implementation, a pair of complementary signals (e.g., sinusoids or square waves, etc.). The circuit 152 may have an output 163 and an output 165 that present the complementary sinusoids. The sinusoids may be used to drive the switching circuits in the circuit 154. The sinusoids, in conjunction with several capacitors (to be described in connection with FIG. 7), are normally used to create a voltage based on the sum of the charged capacitors.

Figure 7:
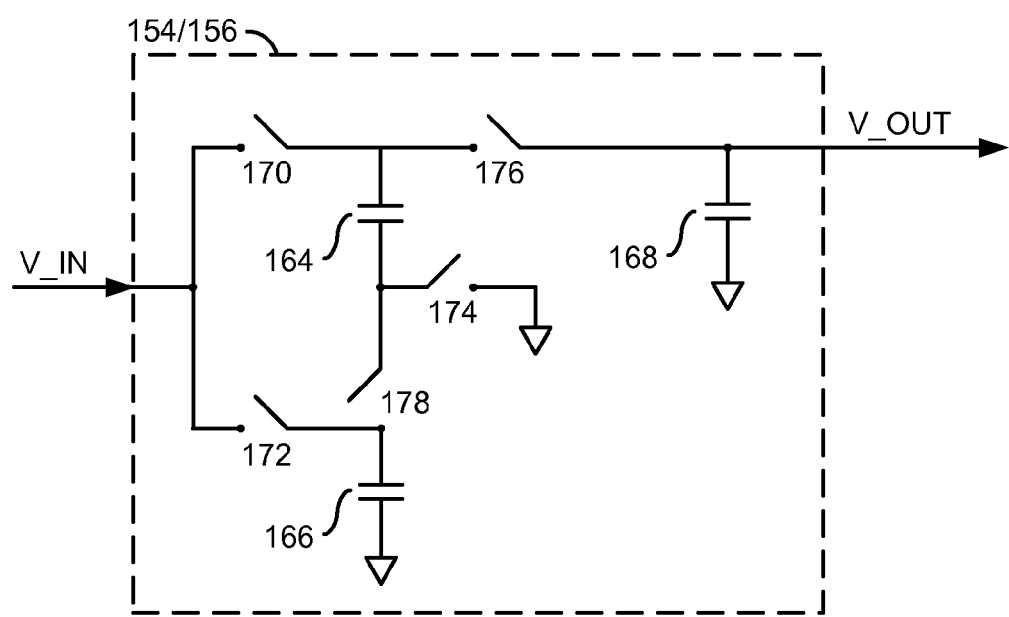
FIG. 7 is a more detailed diagram of the capacitor charging circuit.

Referring to FIG. 7, a more detailed diagram of the switch circuit 154 and the capacitor charging circuit 156 is shown. The circuit 154/156 generally comprises a capacitor 164, a capacitor 166, a capacitor 168, a switch 170, a switch 172, a switch 174 and a switch 176. In response to the FET switch circuit 154, the capacitor 164 and the capacitor 166 may be charged up to the voltage V_IN. The switches 170, 172, 174, 176 and 178 generally form the switching circuit 154. The capacitors 164, 166 and 168 generally form the capacitor charging circuit 156. The switching circuit 154 and the charging circuit 156 have been shown in one schematic diagram for illustrative purposes. The voltage V_OUT will then begin to drop based on the accumulated charge and the applied load. For a very high impedance load, the voltage V_OUT will drop at a pace lower than the rate that the voltage V_OUT was charged. The capacitor 164 and the capacitor 166 may be added in series. The switches 170, 172, 174, 176 and 178 may then be opened and/or closed to allow the charge of the capacitor 164 and the capacitor 166 to be applied to the capacitor 168. If the switches 170, 172 and 174 are closed while the switches 176 and 178 are open, the capacitor 164 and the capacitor 166 are charged. If the switches 170, 172 and 174 are open while the switches 176 and 178 are closed, the capacitor 168 is charged. The capacitors 164, 166 and 168 may be of relatively small value since the reversed biased varactor diode load is a high impedance. While the capacitor 164, 166 and 168 are shown, additional capacitors may be charged and/or switched to extend the output voltage range. Additional switches may also be implemented to meet the design criteria of a particular implementation.

Figure 8:
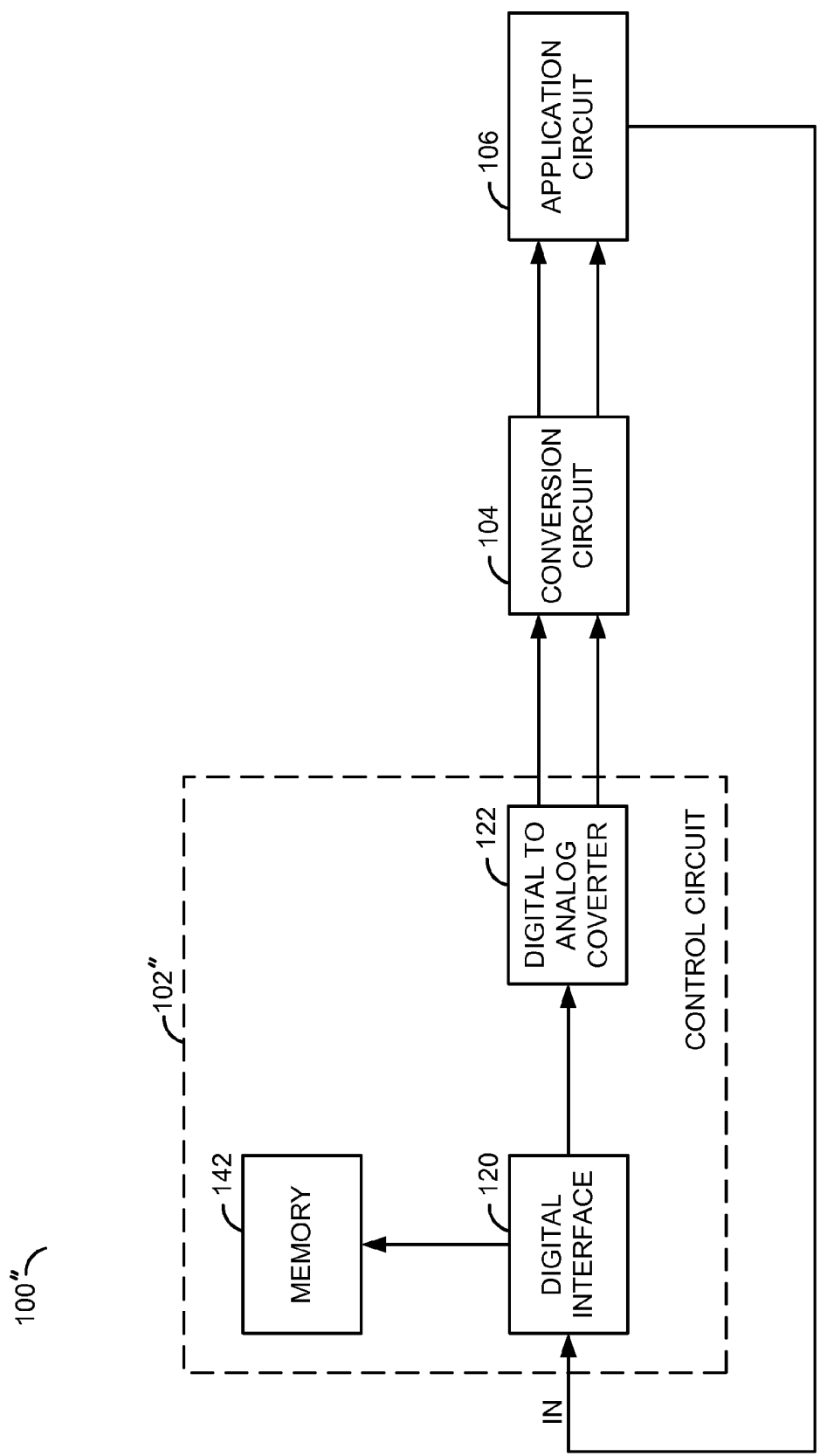
FIG. 8 is a diagram of another embodiment of the present invention.

Referring to FIG. 8, a circuit 100' is shown. A circuit 102" is shown implementing the circuit 120, the circuit 122 and the circuit 142. The circuit 142 may be implemented as a memory circuit. In one example, the memory circuit 142 may store calibration data from the digital interface 120. The memory circuit 142 may enable the storage of data for applying proper voltages to the varactor diode to account for the varactor diode nonlinearities. As a result, the capacitance may be stepped in logical increments. In another example, the memory circuit 142 may allow stabilization over fabrication processes and temperature control.

Figure 9:
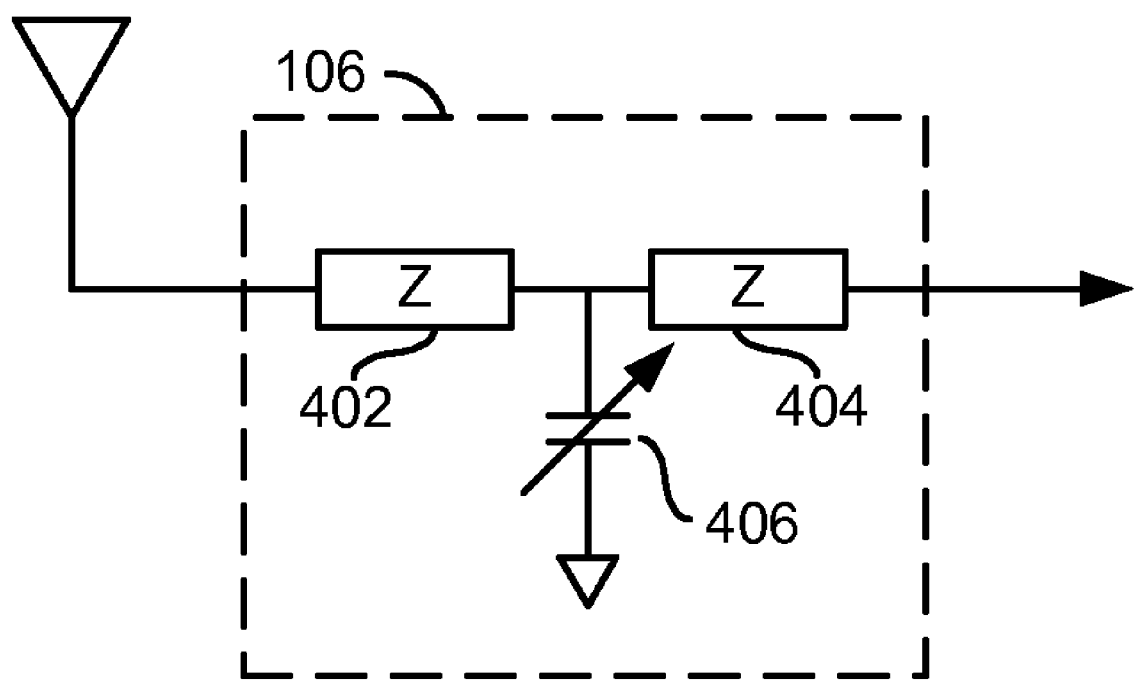
FIG. 9 is a diagram of an example of an application circuit.

Referring to FIG. 9, an example of the application circuit 106 is shown. The application 106 generally comprises a block (or circuit) 402, a block (or circuit) 404 and a circuit 406. The circuit 402 and the circuit 404 may be implemented as impedance blocks. The circuit 406 may be implemented as a variable capacitance. The impedance blocks 402 and 404 may be capacitive, resistive, or inductive.

Figure 10:
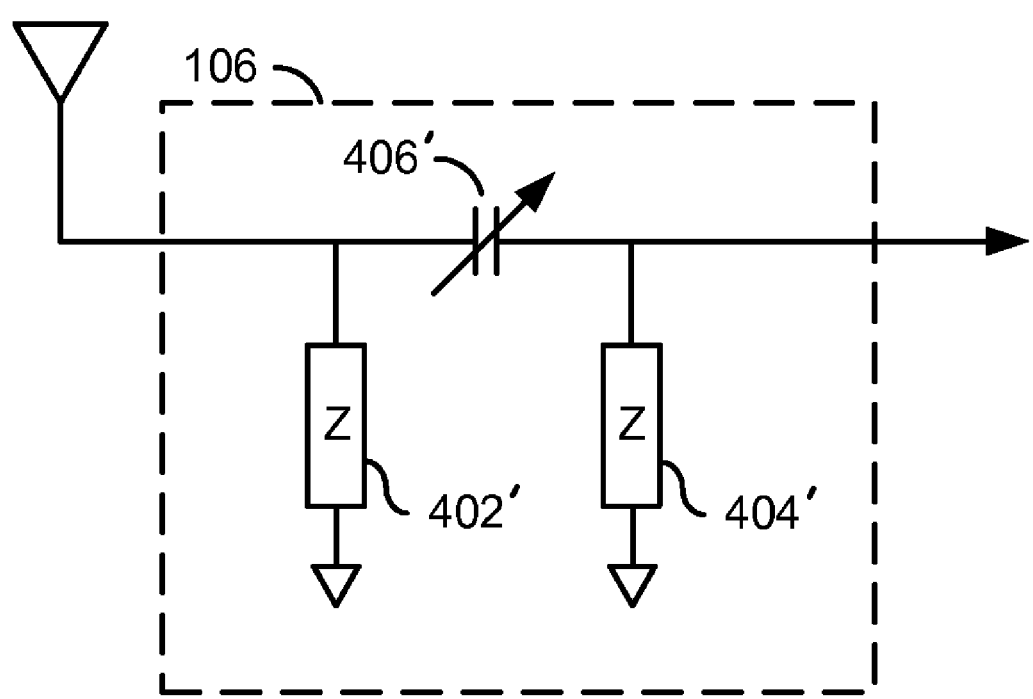
FIG. 10 is a diagram of another example of an application circuit.

Referring to FIG. 10, an example of the application circuit 106 is shown. The impedance blocks 402' and 404' may be capacitive, resistive, or inductive. The circuit 406' may be implemented as a varactor that may be a series element for the application 106. The impedance blocks 402' and 404' may be implemented as shunts on each side of the varactor.

Figure 11:
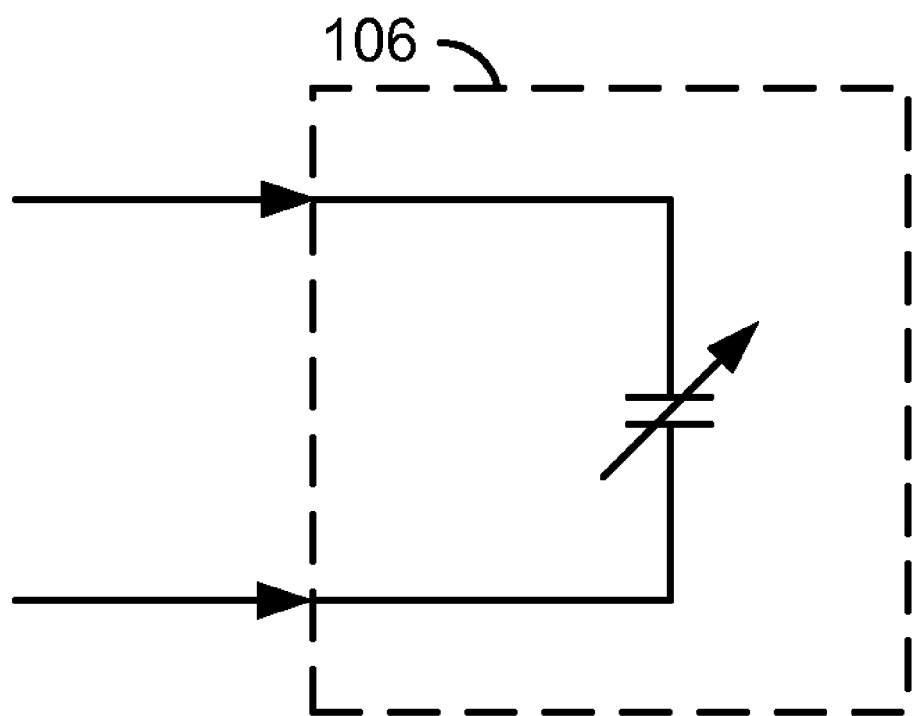
FIG. 11 is a diagram of another example of an application circuit.

Referring to FIG. 11, an example of the application circuit 106 is shown. The application circuit 106 shows a basic application which may be used in design implementations where a variable capacitance is needed.

Figure 12:
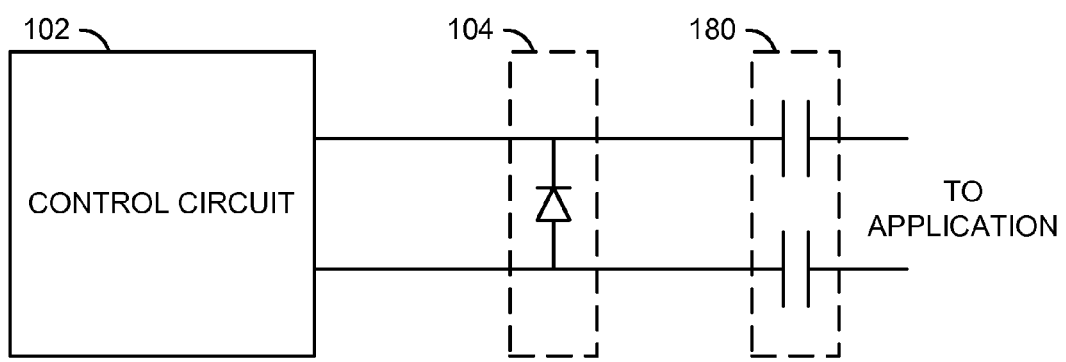
FIG. 12 is a diagram illustrating an example of high Q factor DC blocking capacitors.

Referring to FIG. 12, an example of the circuit 100''' with blocking capacitance section is shown. The circuit 102 may be implemented as a control circuit. The block 104 may be implemented as a varactor diode. The block 180 may be implemented as DC blocking capacitors. When varying the reversed bias voltage across the varactor diode 104, DC current will be present at the device pins of the application. High Q value DC blocking capacitors 180 may be implemented to prevent DC current from being driven into the application circuit.

Figure 13:
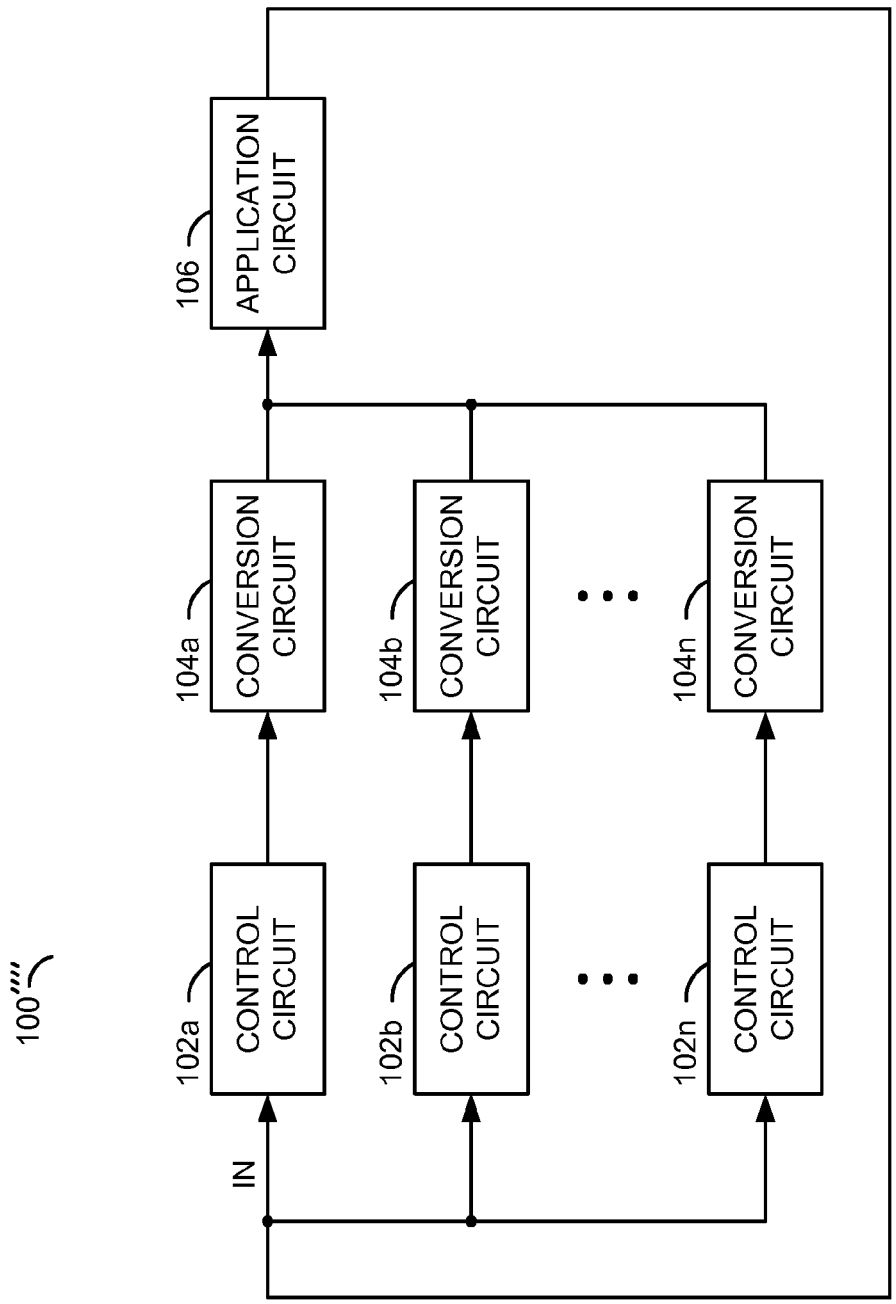
FIG. 13 is a diagram illustrating a plurality of control circuits.

Referring to FIG. 13, an example of the circuit 100'''' with a number of circuits 102a-102n and 104a-104n implemented in parallel and a circuit 106 is shown. The circuits 102a-102n may be implemented as control circuits. The circuits 104a-104n may be implemented as conversion circuits. The circuit 106 may be implemented as an application circuit. The parallel implementation shown may be used to adjust the range of available capacitance values and/or to provide a wider range to the application circuit 106. In addition, using varactor diodes in the control circuits 104a-104n may significantly reduce the series resistance encountered with a multi-bit capacitor switching circuit and the reference insertion loss of the attenuator. A series implementation of the circuits 102a-102n and the circuits 104a-104n may also be implemented to provide finer step sizes. A combination of series and/or parallel circuits may also be implemented.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a control circuit configured to generate an analog control signal in response to a digital control signal, wherein said control circuit comprises a digital interface circuit and a digital-to-analog converter circuit; and
   a conversion circuit configured to generate a capacitance signal in response to said analog control signal, wherein said digital interface circuit comprises a plurality of resistors each configured to be switched in response to said analog control signal.

2. The apparatus according to claim 1, wherein said control circuit generates a plurality of said analog control signals.

3. The apparatus according to claim 1, wherein said conversion circuit generates a plurality of said capacitance signals.

4. The apparatus according to claim 1, wherein said capacitance signal is usable by an application circuit external to said apparatus.

5. The apparatus according to claim 4, wherein said control circuit further responds to an input signal is received from said application circuit.

6. The apparatus according to claim 1, wherein said conversion circuit further comprises a varactor diode.

7. The apparatus according to claim 1, wherein said control circuit further comprises an oscillator circuit.

8. The apparatus according to claim 1, further comprising:
   a plurality of said control circuits each configured to generate one of a plurality of analog control signals; and
   a plurality of said conversion circuits each configured to generate one of a plurality of said capacitance signals.

9. The apparatus according to claim 1, wherein said digital control signal comprises a multi-bit digital word.

10. The apparatus according to claim 1, wherein said digital control signal comprises a serial digital signal.

11. The apparatus according to claim 1, wherein said control circuit comprises a digital interface circuit and a digital-to-analog converter circuit.

12. The apparatus according to claim 11, wherein a plurality of switches each select one of said plurality of resistors in response to a selected one of a plurality of voltage points on a plurality of bond pads.

13. An apparatus comprising:
    means for generating an analog control signal in response to a digital control signal, wherein said generating means comprises a digital interface circuit and a digital-to-analog converter circuit; and
    means for generating a capacitance signal in response to said analog control signal, wherein said digital interface circuit comprises a plurality of resistors configured to be switched in response to said analog control signal.

14. A method for digitally controlling a capacitance comprising the steps of:
    (A) generating an analog control signal in response to a digital control signal, wherein said control circuit comprises a digital interface circuit and a digital-to-analog converter circuit; and
    (B) generating a capacitance signal in response to said analog control signal, wherein said digital interface circuit comprises a plurality of resistors configured to be switched in response to said analog control signal.

15. The apparatus according to claim 13, wherein a plurality of switches each select one of said plurality of resistors in response to a selected one of a plurality of voltage points on a plurality of bond pads.

16. The method according to claim 14, further comprising the step of:
    selecting one of said plurality of resistors in response to a selected one of a plurality of voltage points on a plurality of bond pads.

* * * * *